United States Patent
Sun et al.

(10) Patent No.: US 11,372,324 B2
(45) Date of Patent: Jun. 28, 2022

(54) METHOD FOR CORRECTING MASK PATTERN AND MASK PATTERN THEREOF

(71) Applicant: UNITED MICROELECTRONICS CORPORATION, Hsinchu (TW)

(72) Inventors: Chia-Chen Sun, Kaohsiung (TW); Yu-Cheng Tung, Kaohsiung (TW); Sheng-Yuan Hsueh, Tainan (TW); Fan Wei Lin, Kaohsiung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 220 days.

(21) Appl. No.: 16/272,889

(22) Filed: Feb. 11, 2019

(65) Prior Publication Data

US 2020/0257192 A1 Aug. 13, 2020

(51) Int. Cl.
| | |
|---|---|
| *G03F 1/36* | (2012.01) |
| *G03F 1/38* | (2012.01) |
| *G03F 1/84* | (2012.01) |
| *G03F 7/20* | (2006.01) |

(52) U.S. Cl.
CPC ............ *G03F 1/36* (2013.01); *G03F 1/38* (2013.01); *G03F 1/84* (2013.01); *G03F 7/70441* (2013.01)

(58) Field of Classification Search
CPC ..... G03F 1/36; G03F 1/38; G03F 1/70; G03F 1/70441; G03F 7/70441
See application file for complete search history.

(56) References Cited

U.S. PATENT DOCUMENTS

| | | | | |
|---|---|---|---|---|
| 5,546,225 | A | * | 8/1996 | Shiraishi .................. G03F 1/36 355/53 |
| 5,657,235 | A | * | 8/1997 | Liebmann ................ G03F 1/36 250/492.22 |
| 5,663,893 | A | | 9/1997 | Wampler et al. |
| 5,723,233 | A | * | 3/1998 | Garza ................. G03F 7/70441 430/22 |

(Continued)

FOREIGN PATENT DOCUMENTS

| | | | | |
|---|---|---|---|---|
| JP | 11-084627 | * | 3/1996 | |
| JP | 11-174659 | * | 7/1999 | ............... G03F 1/08 |

(Continued)

OTHER PUBLICATIONS

Machine translation of JP 2005-010635 (Jan. 2005).*
Machine translation of JP 11-174659 (1999).*

*Primary Examiner* — Martin J Angebranndt

(57) ABSTRACT

A method for correcting a mask pattern includes: providing an original mask pattern including at least one dense pattern area and at least one isolated pattern area, and the original mask pattern being divided into a first pattern and a second pattern, wherein the first pattern is formed in the isolated pattern area and extends to the dense pattern area, and the second pattern is formed in the dense pattern area; forming at least one slot on at least one section of the first pattern, and the at least one section of the first pattern is located on at least one transition area between the at least one isolated pattern area and the at least one dense pattern area; and performing an optical proximity correction operation on the first pattern formed with at least one slot and the second pattern. Using the corrected mask pattern may avoid the occurrence of necking or breaking on portion of the post-transfer pattern.

6 Claims, 5 Drawing Sheets

(56) References Cited

U.S. PATENT DOCUMENTS

| | | | | |
|---|---|---|---|---|
| 5,815,685 | A * | 9/1998 | Kamon | G03F 7/70441 716/53 |
| 6,303,253 | B1 * | 10/2001 | Lu | G03F 1/36 430/5 |
| 2002/0051916 | A1 * | 5/2002 | Ki | G03F 1/36 430/30 |
| 2004/0161678 | A1 * | 8/2004 | Misaka | G03F 1/26 430/5 |
| 2006/0003235 | A1 * | 1/2006 | Sugimoto | H01L 21/0274 430/5 |
| 2007/0065730 | A1 * | 3/2007 | Misaka | G03F 1/36 430/5 |
| 2008/0138722 | A1 * | 6/2008 | Sugimoto | G03F 1/36 430/5 |
| 2013/0000505 | A1 * | 1/2013 | Tao | G06F 30/398 101/450.1 |
| 2013/0302724 | A1 * | 11/2013 | Yang | G03F 1/36 430/5 |

FOREIGN PATENT DOCUMENTS

| | | | | |
|---|---|---|---|---|
| JP | 2005-010635 | * | 1/2005 | |
| JP | 2008-310353 | * | 12/2008 | G03F 1/08 |

* cited by examiner

METHOD FOR CORRECTING MASK PATTERN AND MASK PATTERN THEREOF

FIELD OF THE INVENTION

The present invention relates to a method for correcting a mask pattern, and more particularly to the method for correcting the mask pattern with isolated pattern area and dense pattern area, and the mask pattern thereof.

BACKGROUND OF THE INVENTION

Lithography involves the transfer of an image of a mask to a material layer of a die or chip, also referred to as a wafer. The image is formed in a layer of photoresist, the photoresist is developed, and the photoresist is used as a mask during a process to alter the material layer, such as etching and patterning the material layer.

With the rapid development in the integrated level of semiconductor integrated circuits, the width of the line required by lithography is becoming smaller and smaller, and the distance between semiconductor components is also becoming shorter. However, the distance between the above components may be physically limited in the exposure process due to the influence of optical characteristics. The reason is that when exposing, in order to obtain a small-sized component, the interval between the light-transmissive areas of the mask will be reduced in accordance with the size of the component, but if the interval between the light-transmitting areas is reduced to a specific range such as ½ or less of the exposure wavelength, the light passing through the mask will be diffracted, thereby affecting the resolution of the transferred pattern.

Moreover, when the density of the light-transmitting areas on a mask is different, the light passing through the dense light-transmissive area will be affected by the light passing through the isolated light-transmissive area, to cause the exposed pattern to be distorted.

SUMMARY OF THE INVENTION

The present invention provides a method for correcting a mask pattern, and a mask pattern thereof, to avoid the occurrence of necking or breaking on portion of the post-transfer pattern.

In order to achieve one or a portion of or all of the objects or other objects, an embodiment of the invention provides a method for correcting a mask pattern including: providing an original mask pattern including at least one dense pattern area and at least one isolated pattern area, and the original mask pattern being divided into a first pattern and a second pattern, wherein the first pattern is formed in the isolated pattern area and extends to the dense pattern area, and the second pattern is formed in the dense pattern area; forming at least one slot on at least one section of the first pattern, and the at least one section of the first pattern is located on at least one transition area between the at least one isolated pattern area and the at least one dense pattern area; and performing an optical proximity correction operation on the first pattern formed with at least one slot, and the second pattern.

In one embodiment of the invention, the first pattern and the second pattern are strip patterns.

In one embodiment of the invention, the first pattern and the second pattern are alternately arranged in the dense pattern area and parallel to one direction.

In one embodiment of the invention, the at least one slot is elongated and parallel to the direction.

In one embodiment of the invention, the dense pattern area has a first edge area, the isolated pattern area has a second edge area, the first edge area and the second edge area are connected or adjacent, and the at least one slot extends from the transition area to the at least one of the first edge area and the second edge area.

Another embodiment of the invention provides a method for correcting a mask pattern including: providing an original mask pattern, the original mask pattern being divided into a first pattern and a second pattern; determining whether the original mask pattern has at least one isolated pattern area and at least one dense pattern area, and if so, performing a slot adding step, wherein the first pattern is formed in the isolated pattern area and extends to the dense pattern area, the second pattern is formed in the dense pattern area, and in the slot adding step, at least one slot is formed on at least one section of the first pattern, and the at least one section of the first pattern is located on at least one transition area between the at least one isolated pattern area and the at least one dense pattern area, and if not so, go directly to next step without performing the slot adding step; and performing an optical proximity correction operation on the first pattern with or without the slot, and the second pattern.

In one embodiment of the invention, further including a job desk view check step after the optical proximity correction operation.

Another embodiment of the invention provides a mask pattern, including: a plurality of strip patterns parallel to each other, the distribution of the strip patterns including at least one dense pattern area and at least one isolated pattern area adjacent to the dense pattern area, wherein the strip patterns are divided into a first pattern and a second pattern, the first pattern is formed in the isolated pattern area and extends to the dense pattern area, and the second pattern is formed in the dense pattern area; and at least one slot is formed on at least one section of the first pattern, and the at least one section of the first pattern is located on at least one transition area between the at least one isolated pattern area and the at least one dense pattern area.

In one embodiment of the invention, the first pattern includes single strip pattern extending from isolated pattern area to the dense pattern area, and the second pattern comprises two strip patterns located on the dense pattern area and respectively on opposite sides of the first pattern.

In one embodiment of the invention, at least one slot is elongated and parallel to the strip patterns.

In one embodiment of the invention, both ends of the strip patterns each have a widened portion.

In the method for correcting a mask pattern according to the embodiments of the present invention, the first pattern extends from the isolated pattern area to the dense pattern area and/or from the dense pattern area to the isolated pattern area, and by forming a slot on a transition zone of the first pattern, wherein the transition zone is a specific section of the first pattern located on the transition area of the isolated pattern region and the dense pattern region, the light energy on the transition zone of the first pattern is dispersed during the exposure and development process of the mask pattern, so that the light energy is not excessively concentrated on the transition zone of the first pattern, to avoid the occurrence of necking or breaking on portion of the post-transfer pattern.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
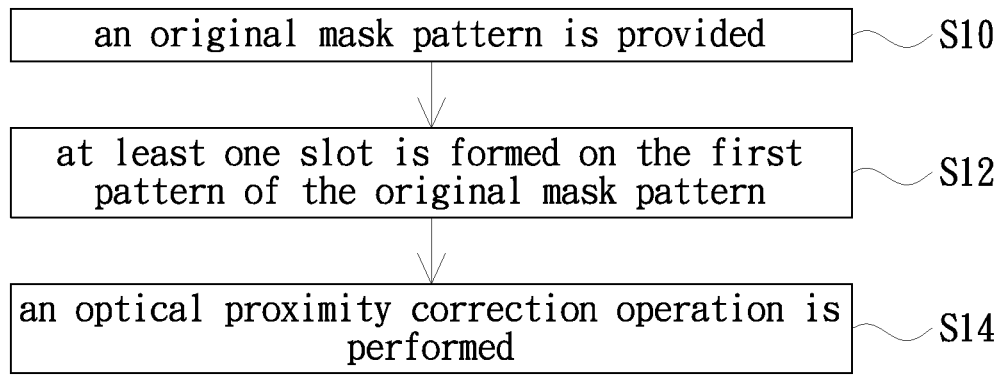
FIG. 1 is a schematic flow chart of a method for correcting a mask pattern according to one embodiment of the present invention.
Figure 2A:
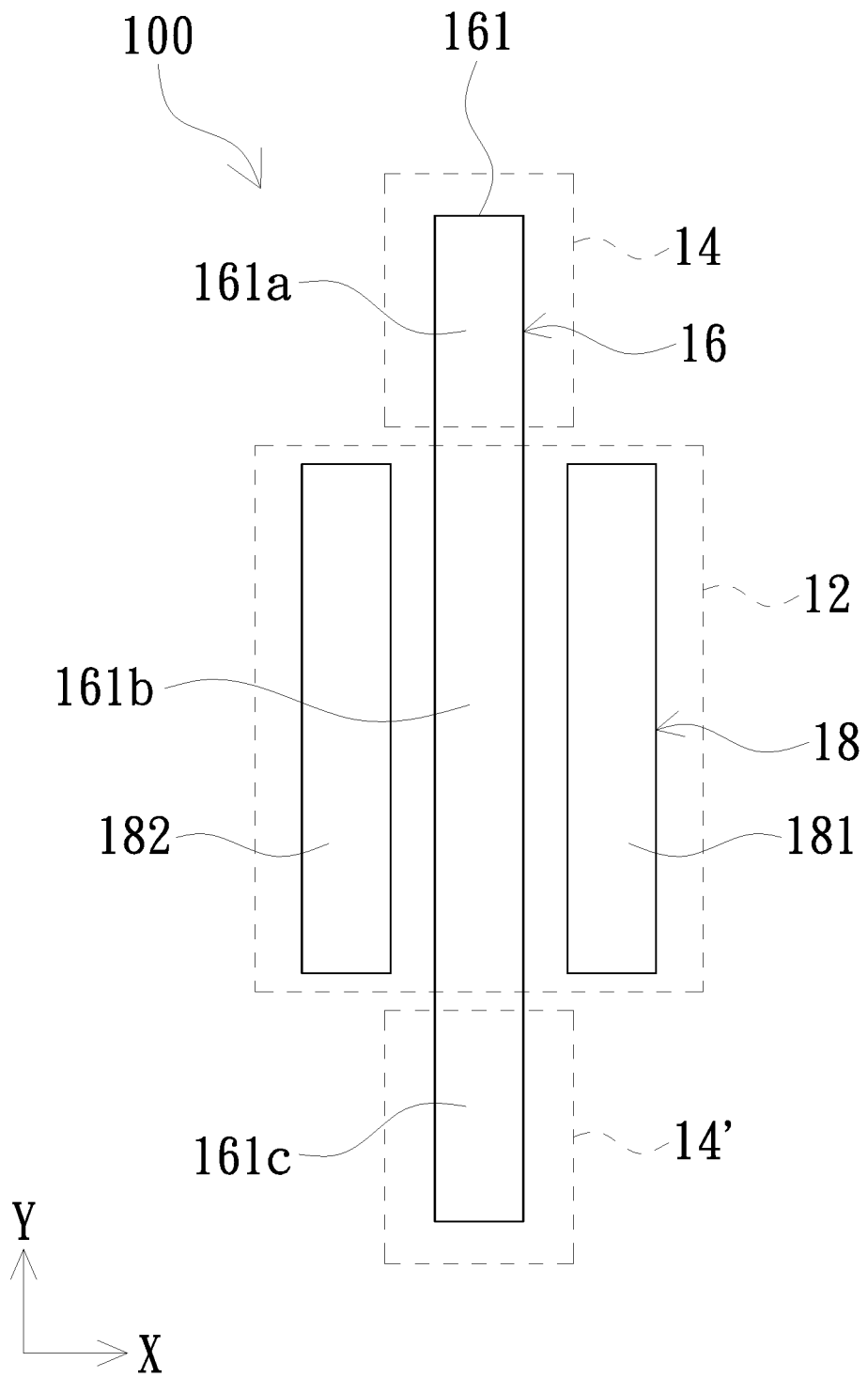
FIG. 2A to FIG. 2C are schematic diagrams of various stages of a method for correcting a mask pattern according to one embodiment of the present invention.
Figure 2B:
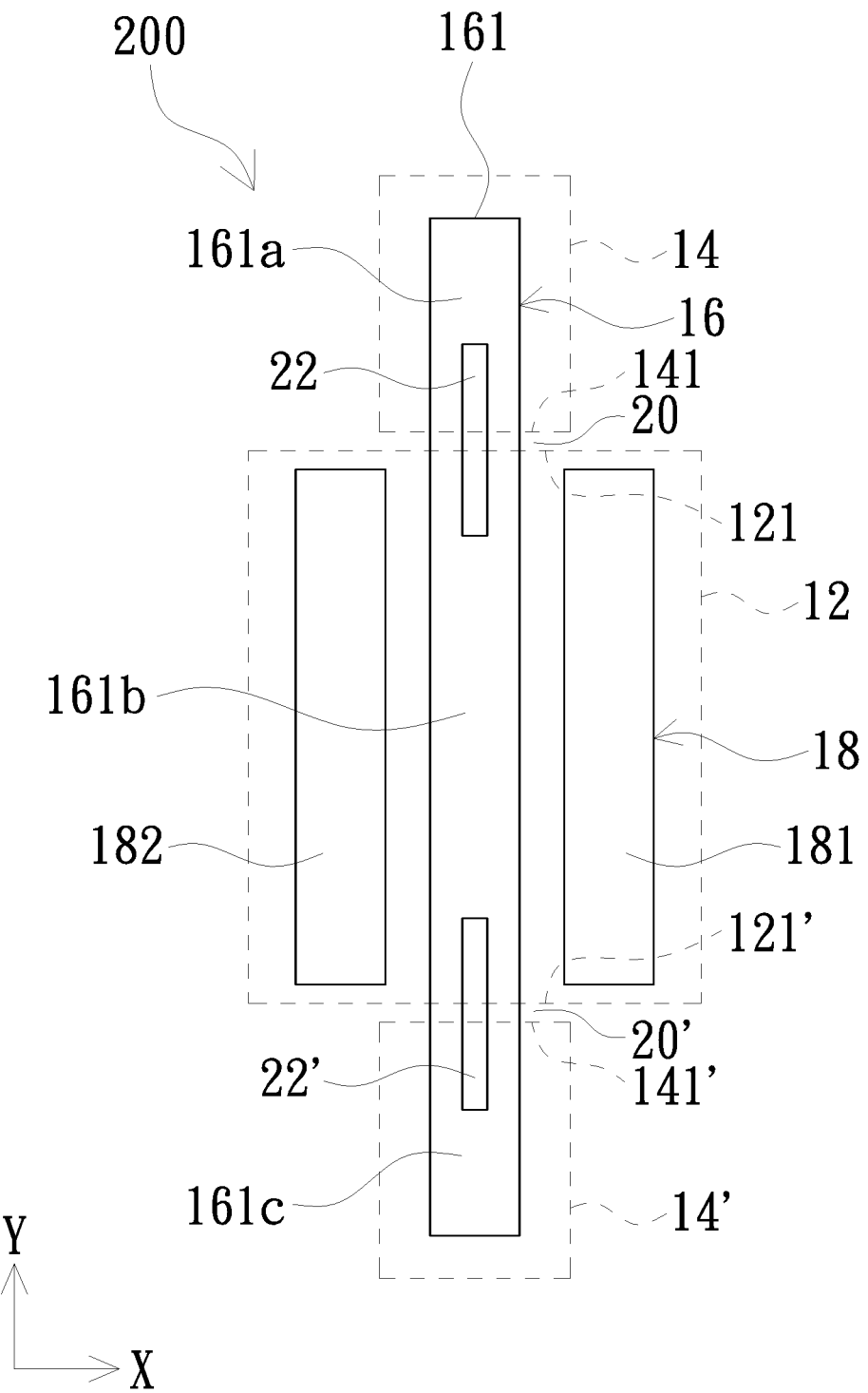
Figure 2C:
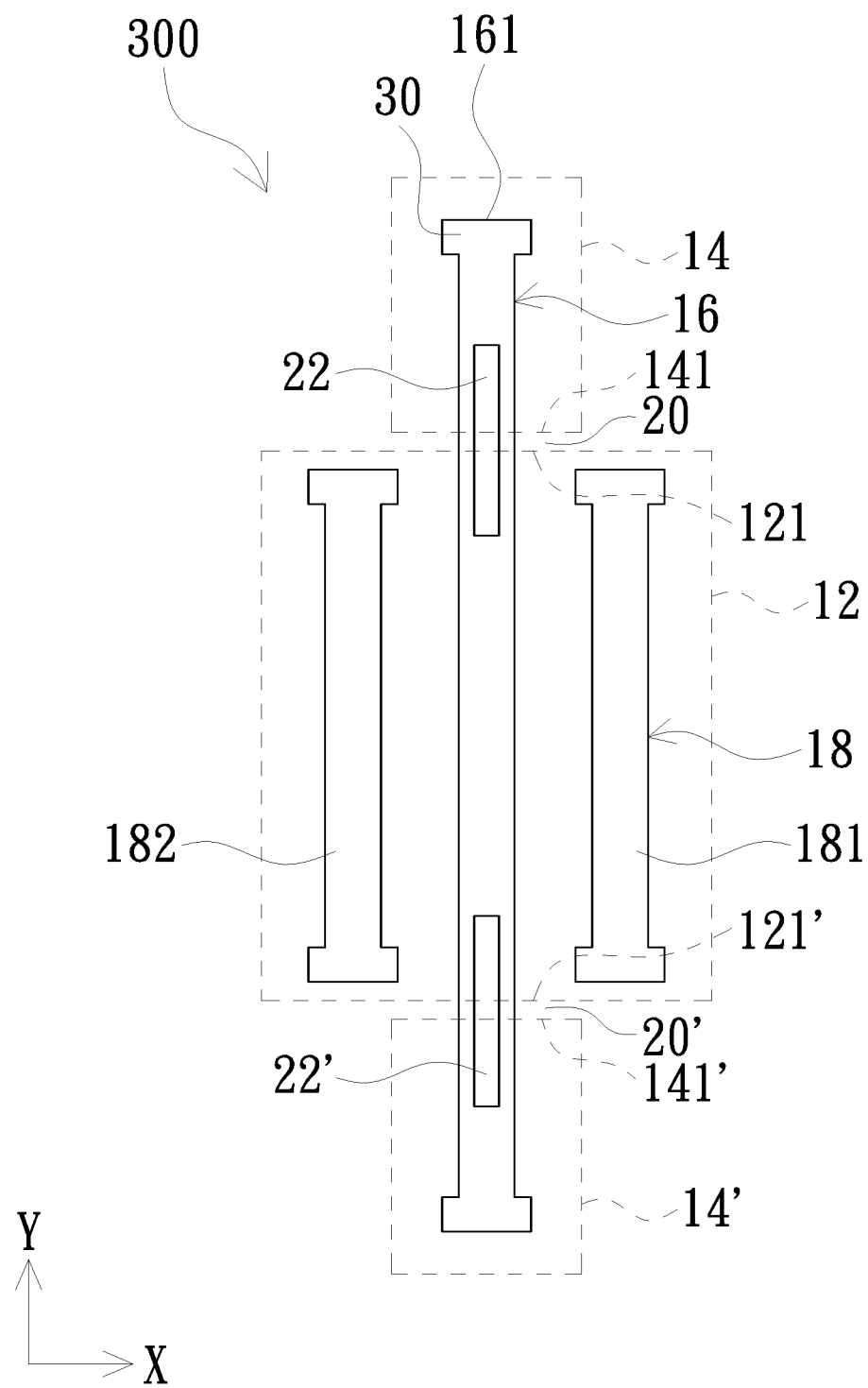

FIG. 1 is a schematic flow chart of a method for correcting a mask pattern according to one embodiment of the present invention, and FIG. 2A to FIG. 2C are schematic diagrams of various stages/steps of a method for correcting a mask pattern according to one embodiment of the present invention, wherein FIG. 2A illustrates an original mask pattern 100 at the beginning of the process, FIG. 2B illustrates a temporary mask pattern 200 having slots on the original mask pattern 100, and FIG. 2C illustrates a corrected mask pattern 300 after an optical proximity correction procedure (OPC) is performed.

Referring to FIG. 1 and FIG. 2A to FIG. 2C, first, in step S10, an original mask pattern 100 is provided. As shown in FIG. 2A, the original mask pattern 100 includes at least one dense pattern area 12 and at least one isolated pattern area 14, and the original mask pattern 100 can be divided into a first pattern 16 and a second pattern 18, wherein the first pattern 16 is formed in the isolated pattern area 14 and extends to the dense pattern area 12, and the second pattern 18 is formed in the dense pattern area 12. In one embodiment, as shown in FIG. 2A, the original mask pattern 100 includes one dense pattern area 12 and two isolated pattern areas 14, 14' as an illustrative example for explanation, wherein the first pattern 16 and the second pattern 18 are strip patterns parallel to one direction, the Y direction, for example, and the first pattern 16 and the second pattern 18 are alternately-arranged in the dense pattern area 12. The first pattern 16 includes, for example, a single strip pattern 161 extending from the isolated pattern area 14 to the dense pattern area 12 and further extending to another isolated pattern area 14', and the second pattern 18 includes, for example, two strip patterns 181, 182 located in the dense pattern area 12 and on opposite sides of the single strip pattern 161, respectively. In other words, the first pattern 16, such as the single strip pattern 161, can be divided into a segment 161a within the isolated pattern area 14, a segment 161b within the dense pattern area 12 and a segment 161c within the isolated pattern area 14', wherein the two strip patterns 181, 182 within the dense pattern area 12 are respectively on opposite sides of the segment 161b.

Next, in step S12, at least one slot 22 is formed on the first pattern 16 to obtain a temporary mask pattern 200. As shown in FIG. 2B, there is a transition area 20 between the isolated pattern area 14 and the dense pattern area 12 and there is another transition area 20' between the isolated pattern area 14' and the dense pattern area 12. In one embodiment, there are two slots, for example, formed on the first pattern, and the two slots are respectively formed on a specific section of the first pattern 16 located on the transition area 20 and on another specific section of the first pattern 16 located on the transition area 20'. In one embodiment, the isolated pattern area 14/14' has a first edge area 141/141', which is adjacent to a second edge area 121/121' of the dense pattern area 12. In one embodiment, the transition area 20/20' is located on an adjacent transition between the first edge area 141/141' and the second edge area 121/121', the slots 22, 22' are elongated and extends toward the first edge area 141/141', and/or the second edge area 121/121'. In one embodiment, the extending directions of the elongated slots 22, 22' are parallel to the first pattern 16, for example, parallel to the Y direction, but is not limited thereto. In other words, the slot 22 is formed on portion of the segment 161a and adjacent portion of the segment 161b, and the slot 22' is formed on portion of the segment 161c and adjacent portion of the segment 161b. In one embodiment, the slots 22, 22' may be hole shape, and the number of slots 22 on the specific section of the first pattern 16 may be multiple.

Then, in step S14, an optical proximity correction operation is performed on the temporary mask pattern 200, that is, the optical proximity correction operation is performed on the first pattern 16 formed with the slots 22, and on the second pattern 18, to obtain a corrected mask pattern 300, as shown in FIG. 2C. The corrected mask pattern 300 includes a plurality of strip patterns parallel to each other, and the distribution of the plurality of strip patterns includes a dense pattern area 12 and two isolated pattern areas 14, 14'. In one embodiment, the plurality of strip patterns may include the first pattern 16 and the second pattern 18, wherein the first pattern 16 includes a single strip pattern 161 extending from the isolated pattern area 14 to the dense pattern area 12 and further extending to another isolated pattern area 14', the second pattern 18 includes two strip patterns 181, 182 on opposite sides of the single strip pattern 161. Two elongated slots 22, 22' are formed on two specific sections of the first pattern 16 and the two specific sections formed with elongated slots 22, 22' are respectively located on the transition area 20, 20' and extends toward the first edge area 141/141' of the isolated pattern area 14, and/or the second edge area 121/121' of the dense pattern area 12. Further, the strip patterns, for example, the first pattern 16 and the second pattern 18, respectively have a widened portion 30 at opposite ends thereof and the widened portion 30 extends, for example, in the X direction.

Figure 3:
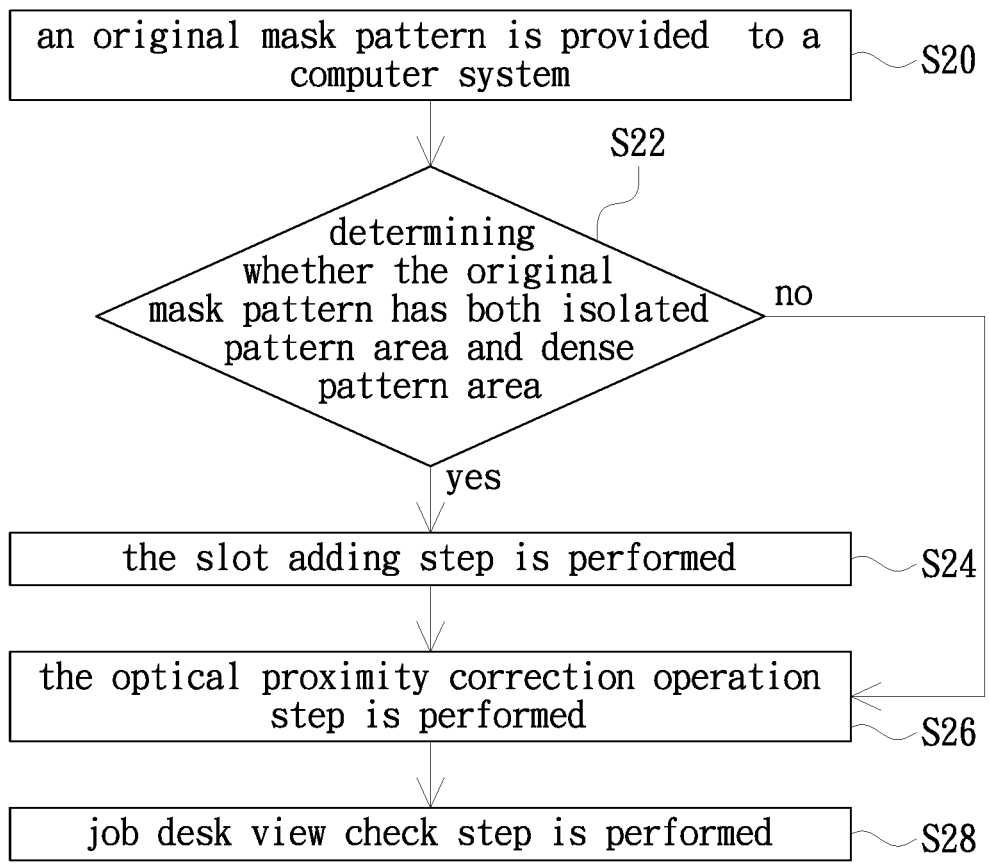
FIG. 3 is a schematic flow chart of a method for correcting a mask pattern according to another embodiment of the present invention.

FIG. 3 is a schematic flow chart of a method for correcting a mask pattern according to another embodiment of the present invention. As shown in FIG. 3, first, in step S20, an original mask pattern is provided to a computer system, as shown in FIG. 2A, wherein the original mask pattern 100 can be divided into a first pattern 16 and a second pattern 18, for example. Next, in step S22, determining whether the original mask pattern 100 has both isolated pattern area and dense pattern area. If the determination is no (determination result deemed negative), the optical proximity correction operation step is performed, which is step S26; if the determination result is yes (determination result deemed positive), a slot adding step, which is step S24, is performed, and after the step of adding the slot is completed, the optical proximity correction operation step of step S26 is proceeded. After the optical proximity correction operation step, a job desk view check (JDV check) step, which is step S28, is performed.

Wherein, in step S24, the original mask pattern 100 has two isolated pattern areas 14, 14' and a dense pattern area 12, wherein the first pattern 16 is formed in the isolated pattern areas 14, 14' and the dense pattern area 12, and the second pattern 18 is formed in the dense pattern area 12, and the slot adding step is performed respectively to form the slots 22, 22' on a specific section of the first pattern 16 located on the transition area 20 and on another specific section of the first pattern 16 located on the transition area 20', to form the temporary mask pattern 200 as shown in FIG. 2B.

Wherein, in step S26, the optical proximity correction operation is directly performed on the original mask pattern 100 if the original mask pattern 100 does not have both isolated pattern area and dense pattern area; or the optical proximity correction operation is performed on the temporary mask pattern 200 if the original mask pattern 100 has both isolated pattern area and dense pattern area.

In the present invention, the first pattern extends from the isolated pattern area to the dense pattern area and/or from the dense pattern area to the isolated pattern area, and by forming a slot on a transition zone of the first pattern, wherein the transition zone is a specific section of the first pattern located on the transition area of the isolated pattern region and the dense pattern region, the light energy on the transition zone of the first pattern is dispersed during the exposure and development process of the mask pattern, so that the light energy is not excessively concentrated on the transition zone of the first pattern, to avoid the occurrence of necking or breaking on portion of the post-transfer pattern.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for correcting a mask pattern, comprising:
providing an original mask pattern comprising at least one dense pattern area and at least one isolated pattern area, and the original mask pattern comprising a first pattern and a second pattern separated by light-transmissive areas, wherein the first pattern comprising at least single strip pattern is formed in the isolated pattern area and extends to the dense pattern area, and the second pattern comprising at least two strip patterns is formed in the dense pattern area and the at least two strip patterns are respectively arranged on opposite sides of portion of the first pattern;
forming at least one slot within at least one section of the first pattern, and the at least one section of the first pattern is located on at least one transition area referring to the place where the first pattern is not adjacent to the second pattern to the place where the first pattern is adjacent to the second pattern, wherein the at least one slot is light-transmissive and is elongated in the same direction as the transition between the at least one isolated pattern area and the at least one dense pattern area, and no slot is formed within the second pattern in dense pattern area, wherein the at least one slot extends equally into the at least one isolated pattern area and the at least one dense pattern area; and
performing an optical proximity correction operation on the first pattern formed with the at least one slot, and the second pattern, to make the first pattern and the second pattern respectively have a widened portion at opposite ends thereof.

2. The method for correcting the mask pattern according to claim 1, wherein the single strip pattern of the first pattern and the two strip patterns of the second pattern are alternately arranged in the dense pattern area and parallel to one direction.

3. A method for correcting a mask pattern, comprising:
providing an original mask pattern comprising a first pattern and a second pattern separated by light-transmissive areas, wherein the original mask pattern has at least one isolated pattern area and at least one dense pattern area;
determining a location of at least one transition area within at least one section of the first pattern, wherein the first pattern comprising at least single strip pattern is formed in the isolated pattern area and extends to the dense pattern area, the second pattern comprising at least two strip patterns is formed in the dense pattern area and the at least two strip patterns are respectively arranged on opposite sides of portion of the first pattern, and at least one slot is formed within at least one section of the first pattern, the at least one section of the first pattern is located on the at least one transition area referring to the place where the first pattern is not adjacent to the second pattern to the place where the first pattern is adjacent to the second pattern, wherein the at least one slot is light-transmissive and is elongated in the same direction as the transition between the at least one isolated pattern area and the at least one dense pattern area, and no slot is formed within the second pattern in dense pattern area, wherein the at least one slot extends equally into the at least one isolated pattern area and the at least one dense pattern area; and
performing an optical proximity correction operation on the first pattern with or without the slot, and the second pattern, to make the first pattern and the second pattern respectively have a widened portion at opposite ends thereof.

4. The method for correcting the mask pattern according to claim 3, wherein the single strip pattern of the first pattern and the two strip patterns of the second pattern are alternately arranged in the dense pattern area and parallel to one direction.

5. A mask pattern, comprising:
a plurality of strip patterns parallel to each other, the distribution of the plurality of strip patterns comprising at least one dense pattern area and at least one isolated pattern area adjacent to the dense pattern area, wherein the plurality of strip patterns comprises a first pattern and a second pattern separated by light-transmissive areas, the first pattern comprising at least single strip pattern is formed in the isolated pattern area and extends to the dense pattern area, and the second pattern comprising at least two strip patterns is formed in the dense pattern area and the at least two strip patterns are respectively arranged on opposite sides of portion of the first pattern; and at least one slot is formed within at least one section of the first pattern, and the at least one section of the first pattern is located on at least one transition area referring to the place where the first pattern is not adjacent to the second pattern to the place where the first pattern is adjacent to the second pattern, wherein the at least one slot is light-transmissive and is elongated in the same direction as the transition between the at least one isolated pattern area and the at least one dense pattern area, and no slot is formed within the second pattern in dense pattern area, wherein the at least one slot extends equally into the at least one isolated pattern area and the at least one dense pattern area.

6. The mask pattern according to claim 5, wherein both ends of the strip patterns each have a widened portion.

* * * * *